(12) United States Patent
Chen et al.

(10) Patent No.: US 11,142,689 B2
(45) Date of Patent: Oct. 12, 2021

(54) YTTRIUM-DOPED BARIUM FLUORIDE CRYSTAL AND PREPARATION METHOD AND USE THEREOF

(71) Applicants: SHANGHAI INSTITUTE OF CERAMICS, CHINESE ACADEMY OF SCIENCES, Shanghai (CN); R&D CENTER, SHANGHAI INSTITUTE OF CERAMICS, Shanghai (CN)

(72) Inventors: Junfeng Chen, Shanghai (CN); Yong Du, Shanghai (CN); Shaohua Wang, Shanghai (CN); Shiyun Sun, Shanghai (CN); Xuenong Zhou, Shanghai (CN); Xiang Li, Shanghai (CN)

(73) Assignees: SHANGHAI INSTITUTE OF CERAMICS, CHINESE ACADEMY OF SCIENCES, Shanghai (CN); R&D CENTER, SHANGHAI INSTITUTE OF CERAMICS, Shanghai (CN)

( * ) Notice: Subject to any disclaimer, the term of this patent is extended or adjusted under 35 U.S.C. 154(b) by 0 days.

(21) Appl. No.: 16/619,401

(22) PCT Filed: Apr. 13, 2018

(86) PCT No.: PCT/CN2018/082952
§ 371 (c)(1),
(2) Date: Dec. 4, 2019

(87) PCT Pub. No.: WO2018/223769
PCT Pub. Date: Dec. 13, 2018

(65) Prior Publication Data
US 2020/0148948 A1    May 14, 2020

(30) Foreign Application Priority Data
Jun. 5, 2017 (CN) .......................... 201710414310.1

(51) Int. Cl.
*C09K 11/77* (2006.01)
*C30B 11/02* (2006.01)
(Continued)

(52) U.S. Cl.
CPC .......... *C09K 11/7705* (2013.01); *C30B 11/02* (2013.01); *C30B 28/06* (2013.01);
(Continued)

(58) Field of Classification Search
CPC ..... C09K 11/7705; C30B 11/02; C30B 28/06; C30B 29/12; G01T 1/2006; G01T 1/2023
See application file for complete search history.

(56) References Cited

U.S. PATENT DOCUMENTS 4,030,965 A * 6/1977 Hammond .............. C30B 11/00
423/497
2006/0090690 A1* 5/2006 Jones .................. C01B 13/0233
117/84
(Continued)

FOREIGN PATENT DOCUMENTS

CN         2648456 Y     10/2004
CN       105463568 A      4/2016

OTHER PUBLICATIONS

Zhou P. et al., "Preparation and near-infrared luminescence," Chin Phys Society vol. 59, No. 4., Apr. 2010, 4 pages.
(Continued)

*Primary Examiner* — Hugh Maupin
(74) *Attorney, Agent, or Firm* — Alleman Hall Creasman & Tuttle LLP

(57) ABSTRACT

Disclosed are a yttrium-doped barium fluoride crystal and a preparation method and the use thereof, wherein the yttrium-doped barium fluoride crystal has a chemical composition of $Ba_{(1-x)}Y_xF_{2+x}$, in which $0.01 \leq x \leq 0.50$. The yttrium-doped $BaF_2$ crystal of the present invention has improved scintil-
(Continued)

lation performance. The yttrium doping may greatly suppress the slow luminescence component of the $BaF_2$ crystal and has an excellent fast/slow scintillation component ratio. The doped crystal is coupled to an optical detector to obtain a scintillation probe which is applicable to the fields of high time resolved measurement radiation such as high-energy physics, nuclear physics, ultrafast imaging and nuclear medicine imaging.

4 Claims, 3 Drawing Sheets

(51) Int. Cl.
C30B 28/06 (2006.01)
C30B 29/12 (2006.01)
G01T 1/20 (2006.01)
G01T 1/202 (2006.01)
C30B 15/04 (2006.01)
C30B 28/10 (2006.01)

(52) U.S. Cl.
CPC ............ C30B 29/12 (2013.01); G01T 1/2006 (2013.01); G01T 1/2023 (2013.01); C30B 15/04 (2013.01); C30B 28/10 (2013.01)

(56) References Cited

U.S. PATENT DOCUMENTS

2009/0121188 A1* 5/2009 Koshimizu ............ G21K 4/00
252/301.4 H
2011/0061587 A1* 3/2011 Ishizu ................ C30B 15/00
117/13

OTHER PUBLICATIONS

Trnovcova V. et al., "Electrical Properties of Heavily Doped Fluorite-Structured BaF2:RF3 (R=Rare Earch Element, Y, Sc) Single Crystals," Solid State Ionics, Jan. 2000, 7 pages.
Sarkisov S et al., "Manifestation of Structural Disorder Peculiarities of Ca3Ga2Ge3O12—Ca3(Nb,Ga)2Ga3O12 and BaF2—YF3 Crystaline Solid Solutions in Fundamental Optical Phonon Spectra," Physica Status Solidi, vol. 119 Issue 1, May 16, 1990, 11 pages.
Sajgalik P et al., "Solid State Chemistry V," Solid State Phenomena, vols. 90-91, Apr. 3, 2003, 7 pages.
Bugaenko, T et al., "Thermal Decay of Photochromic Color Centers in CAf2, SrF2, and BaF2 Crystals Doped by La and Y Impurities," Proceedings of "The XIII Feofilov Symposium Spectroscopy of Crystals Doped by Rare-Earth and Transition-Metal Ions," Jul. 9, 2007, Irkutsk, 3 pages.

* cited by examiner

YTTRIUM-DOPED BARIUM FLUORIDE CRYSTAL AND PREPARATION METHOD AND USE THEREOF

TECHNICAL FIELD

The present application relates to a barium fluoride ($BaF_2$) crystal, in particular to a yttrium-doped barium fluoride crystal, and a preparation method and use thereof.

BACKGROUND

Inorganic scintillation crystals are a kind of photo-functional crystal material capable of converting the absorbed energy of incident energetic rays or particles into pulses of light. The decay time is a dynamic parameter showing the intensity of the pulsed light emitted by a scintillation crystal after absorbing energy as a function of time, and characterizes the response rate characteristics of a scintillation material to energetic rays or particles. It has always been important research interests and hotspot to develop fast scintillators. Barium fluoride ($BaF_2$) crystal is currently known as the fastest inorganic scintillator, having a fast scintillation component peaked at 195 nm and 220 nm with a decay time of less than 1 ns. The light output of $BaF_2$ crystal is about twice that of LSO/LYSO:Ce crystal within the initial 0.1 ns of luminescence process. $BaF_2$ crystal has a good radiation resistance and a relatively low price. From the end of the 1980s to the early 1990s, this unique scintillation crystal has been widely used as one of important candidates for electromagnetic calorimeters in many particle physics experiments, and attracted much attention. However, besides the fast scintillation component, this crystal has also a slow scintillation component peaked at 300 nm with a decay time of about 600 ns and with a light output of four to five times that of the fast scintillation component. During the measurement at a high count rate ($>10^6$ Hz), the slow component would cause serious signal pile-up, which greatly limits its application in fields such as high rate counting and time-resolved radiation measurement.

Suppression of the slow scintillation component of $BaF_2$ crystal is a basic prerequisite for the wide application of the crystal. There are mainly three approaches to suppress the impact of slow scintillation component: the first is the use of photodetectors sensitive only to fast scintillation component, such as a photomultiplier tube using TMAE, Cs—Te, K—Cs—Te or Rb—Te as a photocathode material, an avalanche photodiode, or a silicon photomultiplier tube, etc.; the second is to reduce the light output of the slow scintillation component by increasing crystal temperature or by selective doping; and the third is to regulate the transmission of light between the crystal and the photodetector, such as the separation of the fast scintillation component by organic shifting materials, and the selective filtering of the slow scintillation component by photonic crystal structure and reflective VUV bandpass filters.

Selective doping, i.e., incorporation a certain amount of other ions such as $La^{3+}$ ions into $BaF_2$ crystal to make the luminescence intensity of the slow scintillation component weaker, is a more practical approach, and has attracted sustained attention over the past three decades. Nowadays, with the latest fast component-sensitive detectors and bandpass filter apparatus, selective doping is expected to drive $BaF_2$ crystal to a wide range of applications. In 1989, P. Schotanus et al. found that introducing a certain concentration of $La^{3+}$ ions into $BaF_2$ crystals can significantly attenuate the luminescence intensity of the slow scintillation component, while the fast scintillation component of $BaF_2$ remains unaffected. C. L. Woody et al. found that La-doping preserves the irradiation hardness of $BaF_2$ crystal. From then on, the La-doping has received the most extensive attention, and the research on the doping amount optimization, suppression characteristics, and suppression mechanism of La-doping has made great progress. Although it is controversial that the mechanism of slow component suppression is whether the reduction of the dissociation energy of STE due to interstitial $F^-$ ion, the reduction of the number of STE due to La-doping, or the formation of H center that does not contribute to STE luminescence due to the combination of the $V_k$ center and the interstitial $F^-$ ion, the conclusions that La-doping can suppress the slow component are consistent.

Unfortunately, although La-doping can suppress the slow scintillation component of $BaF_2$ crystal, the preparation of La-doped $BaF_2$ crystal has great technical challenges, and La-doping will inevitably introduce the background radioactivity of $^{138}La$ isotope, which limits the wide use of $La^{3+}$ as a slow component suppression ion. It is urgent to search other slow component suppression doping ions for easier growth of large-size doped crystals with high optical quality, to promote the substantial application of $BaF_2$ crystal in the high time-resolved fields.

SUMMARY

Technical Problem

In view of the above problems, an object of the present application is to provide a yttrium-doped barium fluoride crystal with suppressed slow scintillation component, and a preparation method and application thereof, to remarkably improve the time resolved characteristics of barium fluoride crystals.

TECHNICAL SOLUTION

In one aspect, the present application provides a yttrium-doped barium fluoride crystal, the yttrium-doped barium fluoride crystal having a chemical composition of $Ba_{(1-x)}Y_xF_{2+x}$, wherein $0.01 \leq x \leq 0.50$.

According to the physical property of $Y^{3+}$ ion that the ionic radius and electronegativity thereof are similar to those of $La^{3-}$ ion, a certain concentration (1 to 50 at %) of $Y^{3+}$ ions is introduced into a $BaF_2$ crystal matrix, thereby interstitial fluoride ions $F_i^-$ are introduced into the crystal lattice after the $Y^{3+}$ ions entering the $BaF_2$ crystal matrix, to destroy the self-trapped exciton luminescence process, so that the luminescence intensity of the slow scintillation component is weakened. Because the melting point of $LaF_3$ (1493° C.) is much higher than that of $BaF_2$ (1368° C.), a La-doped $BaF_2$ crystal grown is prone to having macroscopic defects such as bubbles and inclusions. The growth of high optical quality La-doped crystals has always been a great challenge. The melting point of $YF_3$ (1387° C.) is very close to that of $BaF_2$. As compared with La-doping, Y-doping is much easier to achieve precise control of doping stoichiometry, and the doping does not increase the difficulty of crystal growth. Y-doping does not introduce the radioactive background of the $^{138}La$ isotope, thus the yttrium-doped barium fluoride crystal can be used in the field of low-background radiation detection. The density of $YF_3$ (4.01 $g/cm^3$) is lower than that of $LaF_3$ (5.9 $g/cm^3$), thus the mass of the $YF_3$ dopant is 47% less than that of the $LaF_3$ dopant at the same doping stoichiometric ratio, making $Y^{3+}$ doping have a significant cost advantage.

Preferably, the yttrium-doped barium fluoride crystal may be used in monocrystalline or a polycrystalline state.

In another aspect, the present application provides a method for preparing the yttrium-doped barium fluoride crystal, comprising the steps of:

weighing and mixing raw materials of $YF_3$ and $BaF_2$ according to the molar ratio $BaF_2 : YF_3 = (1-x) : x$ to obtain a mixed powder, wherein $0.01 \leq x \leq 0.50$;

putting the mixed raw materials into a crucible in a vacuum furnace for thorough melting and mixing, and then cooling the mixture to obtain $Ba_{(1-x)}Y_xF_{2+x}$ polycrystalline material, or subjecting the mixed powder to isostatic pressing, and putting the resulting substance into crucibles and sintering it at 900 to 1200° C. in vacuum to obtain sintered $Ba_{(1-x)}Y_xF_{2+x}$ polycrystalline material; and mixing the resulting polycrystalline material with a appropriate amount of $PbF_2$ powder, and growing crystals by a melt method.

Preferably, the growth method may include vertical Bridgman method or Czochralski method.

Preferably, the growth processes of the vertical Bridgman method may include:

maintaining a vacuum degree of less than $10^{-3}$ Pa, melting the $Ba_{(1-x)}Y_xF_{2+x}$ polycrystalline material and $PbF_2$ powder at 1200 to 1400° C., subjecting the resulting melt to crystal growth wherein the descending speed of the crucible is 0.5 to 4 mm/hour, and cooling the grown crystal to room temperature at a temperature decreasing rate of 10 to 50° C./hour.

Preferably, the crucible may be a high purity graphite crucible or a glassy carbon crucible.

Preferably, the isostatic pressing may be performed at a pressure of 5 to 20 MPa for 0.1 to 1 hour, and the temperature for the thorough melting is 1200 to 1400° C.

Preferably, the deoxidizer $PbF_2$ may be added in an amount of 0.1 to 5 wt %, preferably 0.5 to 2 wt %, by weight of the $Ba_{(1-x)}Y_xF_{2+x}$ polycrystalline material.

In the third aspect, the present application provides a scintillation crystal probe, comprising the above-described yttrium-doped barium fluoride crystal, and a photomultiplier tube, an avalanche photodiode or a silicon photomultiplier tube coupled to the yttrium-doped barium fluoride crystal. The yttrium-doped barium fluoride crystal may be used in monocrystalline state, or may be in polycrystalline state, which is uniformly dispersed in a transparent medium, or in crystal array state formed by a plurality of crystal elements.

In the fourth aspect, the present application provides use of the above-described yttrium-doped barium fluoride crystal in the field of high time-resolved radiation detection.

The yttrium-doped barium fluoride crystal with a high suppression ratio of the slow component prepared herein can be used in the fields of high time-resolved radiation detection. These fields include, but are not limited to, high energy physics, nuclear physics, nuclear medicine imaging, X-ray imaging, etc. The yttrium-doped barium fluoride crystal is used in the form of monocrystalline or polycrystalline in these fields.

As compared with $BaF_2$ crystal with La-doping, the —$BaF_2$ crystal with Y-doping of the present application also has an excellent fast/slow scintillation ratio, is much easier to grow, does not introduce the radioactive background of $^{138}La$ isotope, and needs less amount of dopants at the same doping stoichiometric ratio, thus having a significant comparative advantage. The yttrium-doped barium fluoride crystals of the present application are suitable for use in the fields of high time-resolved radiation detection.

The X-ray excitation emission spectra of undoped/pure $BaF_2$ and 1 at % Y-doped $BaF_2$ crystal at room temperature are shown in FIG. 1. As can be seen from FIG. 1, the luminescence intensity of the slow scintillation component peaked at 300 nm in the X-ray excited emission (XEL) spectrum of —$BaF_2$ crystal with Y-doping changes significantly as compared to the undoped $BaF_2$ crystal. FIG. 2 shows the comparison of light output and decay kinetic characteristics of undoped/pure $BaF_2$ (top) and 1 at % Y-doped $BaF_2$ crystal (bottom) with dimensions of $30*30*20$ $mm^3$ at different integrate time. It can be seen that the fast scintillation component of 1 at % Y-doped $BaF_2$ crystal is equivalent to that of the undoped $BaF_2$ crystal, while the slow scintillation component is reduced from 906 ph./MeV to 146 ph./MeV, and the fast/slow component ratio is increased from 0.2 to 1.3, and the slow component suppression ratio is up to 6.44. Under the same process conditions, —it easier to grow large-sized $BaF_2$ crystals with Y-doping. FIG. 3 shows a Y-doped $BaF_2$ crystal with a length of 200 mm, which can meet the requirement for large-size $BaF_2$ crystals in high energy physical scientific facilities at the intensity frontiers, such as Mu2e, Project X, etc.

DETAILED DESCRIPTION

Figure 1:
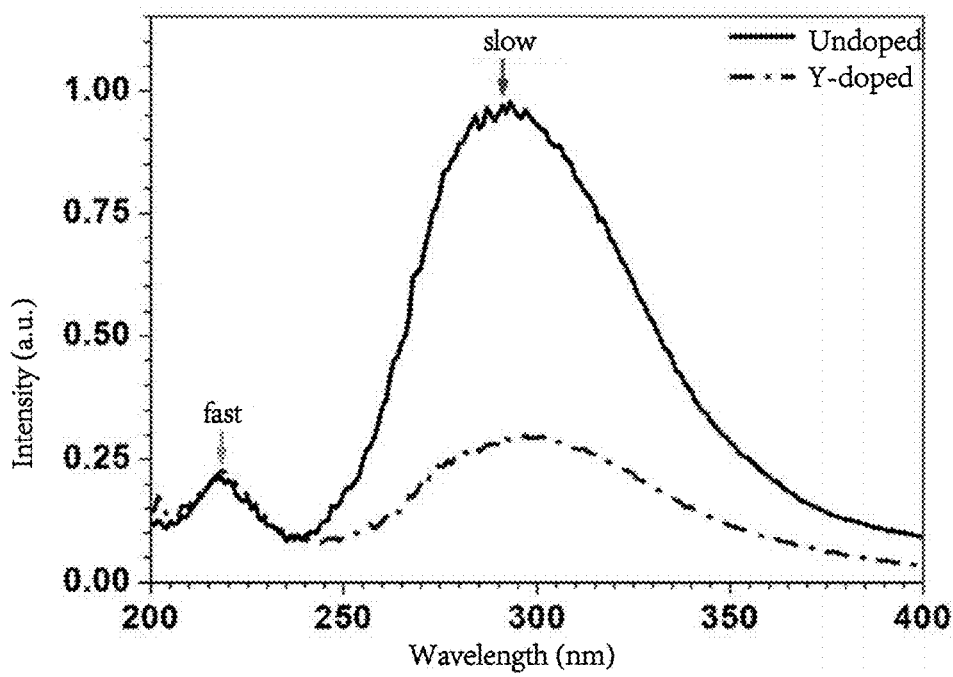
FIG. 1 shows the X-ray excited emission (XEL) spectra of undoped $BaF_2$ and 1 at % Y-doped $BaF_2$ crystal at room temperature, wherein the solid line represents the spectrum of undoped $BaF_2$, and the dash line represents the spectrum of Y-doped $BaF_2$ crystal.
Figure 2:
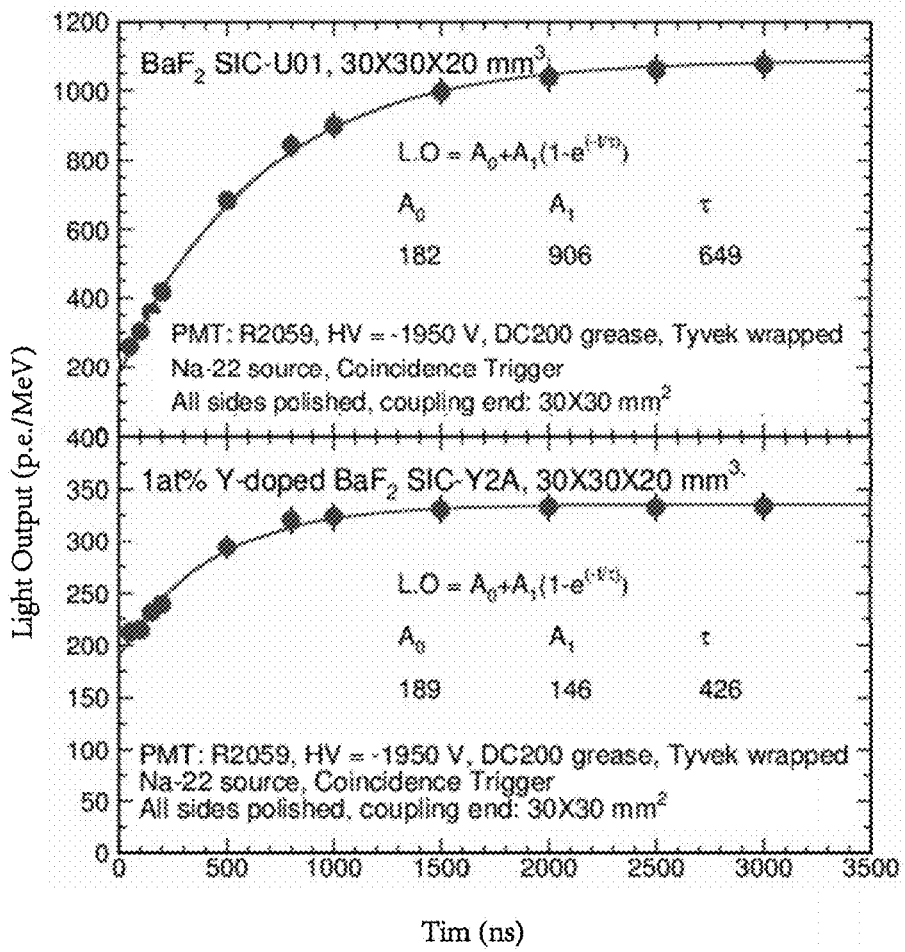
FIG. 2 shows the light output and decay kinetic characteristics of undoped $BaF_2$ and 1 at % Y-doped $BaF_2$ crystal at different integrate time.
Figure 3:
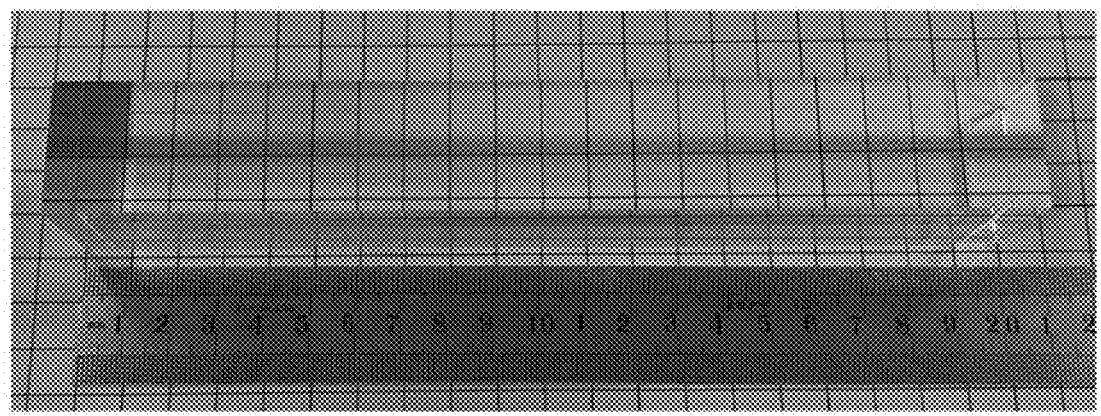
FIG. 3 shows an 1 at % Y-doped $BaF_2$ crystal with a length of 200 mm.

The present invention will be further described with the following embodiments below. It should be understood that the following embodiments are only used for explaining this invention, but not to limit this invention.

The present application relates to the improvement of the scintillation performance, especially time response characteristics of $BaF_2$ crystal. Yttrium-doping can greatly suppress the slow scintillation component of $BaF_2$ crystal. The yttrium-doped barium fluoride crystal has a chemical composition of $Ba_{(1-x)}Y_xF_{2+x}$, wherein x represents the doping concentration of the yttrium, and $0.01 \leq x \leq 0.50$. If the doping concentration of the yttrium is too high, the cost of the crystal will be greatly increased, and the density of the doped crystal will be lowered, which is unfavourable for the radiation detecting efficiency. Preferably, $0.01 \leq x \leq 0.10$. The yttrium-doped barium fluoride crystal may be in monocrystalline or polycrystalline state. The yttrium-doped crystal can be used in the fields of high time-resolved radiation such as high energy physics, nuclear physics, ultrafast imaging, nuclear medicine imaging, etc.

In the present application, the raw materials are thoroughly mixed according to the molar ratio of $BaF_2$:$YF_3$=1−x (x=0.01-0.50), and an appropriate amount of $PbF_2$ is added as a deoxidizing agent. The resulting mixture is subjected to crystal growth by using vertical Bridgman furnace in vacuum. The preparation method of the yttrium-doped barium fluoride crystal provided by the present application will be exemplified below.

Preparation of $Ba_{(1-x)}Y_xF_{2+x}$ polycrystalline material. Raw materials of $YF_3$ and $BaF_2$ are weighed and mixed according to the molar ratio $BaF_2$: $YF_3$=(1−x): x to obtain a mixed material. Specifically, $BaF_2$ powder having a purity of 99.99% or more and $YF_3$ powder having a purity of 99.9% or more are used as raw materials, and these raw materials are fully dried in a vacuum oven at 150 to 200° C. The dried raw materials are weighed according to the molar ratio of $BaF_2$:$YF_3$=(1−x): x (wherein x is 0.01 to 0.50), an appropriate amount of $PbF_2$ powder is weighed as a deoxidizer, and $BaF_2$, $YF_3$ and $PbF_2$ are thoroughly mixed to obtain a mixed powder.

The mixed powder is fed into a crucible, thoroughly melted and mixed in a vacuum furnace at 1200 to 1400° C., and cooled, to obtain a $Ba_{(1-x)}Y_xF_{2+x}$ polycrystalline material. As an example, the mixture is fed into a high-purity graphite crucible or a glassy carbon crucible, and then the mixture is thoroughly and mixed in a vacuum furnace to obtain a $BaF_2$—$YF_3$ solid solution melt, and the solid solution melt is cooled to obtain $Ba_{(1-x)}Y_xF_{2+x}$ polycrystalline material.

Alternatively, the mixed powder is subjected to isostatic pressing, fed into a crucible, and then sintered at 900 to 1200° C. in vacuum to obtain $Ba_{(1-x)}Y_xF_{2+x}$ polycrystalline material. The isostatic pressing may be performed at a pressure of 5 to 20 MPa for 0.2 to 2 hours. The crucible may be a high purity graphite one or a glassy carbon one. As an example, the mixed raw materials are put into a plastic bag and isostatically pressed in an isostatic press, and then transferred into a high-purity graphite or a glassy carbon crucible, placed in a vacuum furnace for sintering at a temperature of 900 to 1200° C., and cooled, to obtain $Ba_{(1-x)}Y_xF_{2+x}$ polycrystalline material.

The $Ba_{(1-x)}Y_xF_{2+x}$ polycrystalline material is mixed with an appropriate amount of $PbF_2$ powder, and subjected to crystal growth by a melt method. The melt method includes, but is not limited to, vertical Bridgman method and Czochralski method. The deoxidizer $PbF_2$ may be added in an amount of 0.1 to 5 wt %, preferably 0.5 to 2 wt %, of the $Ba_{(1-x)}Y_xF_{2+x}$ polycrystalline material.

The processes of the vertical Bridgman method include: maintaining a vacuum degree of less than $10^{-3}$ Pa, melting the $Ba_{(1-x)}Y_xF_{2+x}$ polycrystalline material and $PbF_2$ powder at 1200 to 1400° C., subjecting the resulting melt to start the crystal growth, wherein the descending speed of the crucible is 0.5 to 4 mm/hour, and cooling the grown crystal to room temperature at a temperature decreasing rate of 10 to 50° C./hour. Specifically, a high-purity graphite crucible or a glassy carbon crucible having a capillary structure at the bottom is machined according to the size and number of crystals to be grown, and the $Ba_{(1-x)}Y_xF_{2+x}$ polycrystalline material and an appropriate amount of $PbF_2$ powder are fed into the graphite crucibles or the glassy carbon crucibles, and placed into a vertical vacuum Bridgman furnace. A vacuum pumping device is turned on so that the vacuum inside the furnace is less than $10^{-3}$ Pa, and then the temperature is gradually increased to thoroughly melt the raw material, and a descending device is turned on for crystal growth, wherein the descending speed is 0.5 to 4 mm/h. After the growth is completed, the crystal is cooled to room temperature at a temperature decreasing rate of 10 to 50° C./hour, and as-grown crystal ingot is taken out for machining.

The yttrium-doped crystal in the present application can be coupled to a photodetector such as a photomultiplier tube, an avalanche photodiode, and a silicon photomultiplier tube for use in the field of high time-resolved radiation detection. The present application relates to the improvement of the scintillation performance, especially time response characteristics of $BaF_2$ crystal. Yttrium doping can greatly suppress the slow scintillation component of $BaF_2$ crystal. That is, the yttrium-doped barium fluoride crystal of the present application has an excellent fast/slow scintillation ratio, and the yttrium-doped crystal can be coupled to a photodetector to form a scintillation probe, which is applicable to the field of high time-resolved radiation, including but not limited to, high energy physics, nuclear physics, ultrafast imaging, nuclear medicine imaging, etc.

Hereinafter, the present invention will be better described with the following representative examples. It should be understood that the following examples are only used to explain this invention and do not limit the scope of this invention. Any non-essential improvements and modifications made by a person skilled in the art based on this invention are all protected under the scope of this invention. The specific parameters below are only exemplary, and a person skilled in the art can choose proper values within an appropriate range according to the description of this article, and are not restricted to the specific values cited below. It should be noted that the embodiments described below are only for explaining the application, and are a part of but not all of the embodiments of the application. Based on the embodiments of the present application, all other embodiments obtained by those skilled in the art without creative efforts are within the protection scope of the application.

Example 1

Preparation of 1 at % Y-Doped $BaF_2$ Crystal

1) $BaF_2$ having a purity of 99.99% and $YF_3$ having a purity of 99.9% were used as the starting materials. These starting materials were weighed in a molar ratio of $BaF_2$:$YF_3$=0.99:0.01, and heated in a vacuum oven at 200° C. for 20 hours. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a high-purity graphite crucible, and then thoroughly melted in a vacuum furnace at 1300° C. to obtain a $BaF_2$—$YF_3$ solid solution melt. The melt was cooled to room temperature to obtain $Ba_{0.99}Y_{0.01}F_{2.01}$ polycrystalline material.

3) A high-purity graphite crucible or a glassy carbon crucible having a capillary structure at the bottom was machined according to the size and number of crystals to be grown, and the $Ba_{0.99}Y_{0.01}F_{2.01}$ polycrystalline material and an appropriate amount of $PbF_2$ powder were fed into the graphite crucible, and placed into a vacuum crucible descending furnace, wherein the deoxidizer $PbF_2$ was added in an amount of 0.5 wt % of the $Ba_{(1-x)}Y_xF_{2+x}$ polycrystalline material.

4) A vacuum pumping device was turned on so that the vacuum degree inside the furnace was less than $10^{-3}$ Pa, and then the temperature was gradually increased to 1300° C. to thoroughly melt the raw material, and a descending device was turned on for crystal growth, wherein the descending speed was 2 mm/h. After the growth was completed, the crystal was cooled to room temperature at a temperature decreasing rate of 50° C./hour, and the crystal ingot was taken out for machining.

Example 2

Preparation of 10 at % Y-Doped $BaF_2$ Crystal

1) $BaF_2$ having a purity of 99.99% and $YF_3$ having a purity of 99.99% were used as the starting materials. These starting materials were fully dried in a vacuum oven, and weighed in a molar ratio of $BaF_2$:$YF_3$=0.90:0.10. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a glassy carbon crucible, and then thoroughly melted in a vacuum furnace at 1350° C. to obtain a $BaF_2$—$YF_3$ solid solution melt. The melt was cooled to room temperature to obtain $Ba_{0.9}Y_{0.1}F_{2.1}$ polycrystalline material.

3) A high-purity graphite crucible having a capillary structure at the bottom was machined according to the size and number of crystals to be grown, and the $Ba_{0.9}Y_{0.1}F_{2.1}$ polycrystalline material and an appropriate amount of $PbF_2$ powder were fed into the graphite crucible, and placed into a vacuum crucible descending furnace, wherein the deoxidizer $PbF_2$ was added in an amount of 1 wt % of the $Ba_{(1-x)}Y_xF_{2+x}$ polycrystalline material.

4) A vacuum pumping device was turned on so that the vacuum degree inside the furnace was less than $10^{-3}$ Pa, and then the temperature was gradually increased to 1350° C. to thoroughly melt the raw material, and a descending device was turned on for crystal growth, wherein the descending speed was 1 mm/h. After the growth was completed, the crystal was cooled to room temperature at a temperature decreasing rate of 25° C./hour, and the crystal ingot was taken out for machining.

Example 3

Preparation of 20 at % Y-Doped $BaF_2$ Crystal

1) $BaF_2$ having a purity of 99.99% and $YF_3$ having a purity of 99.99% were used as the starting materials. These starting materials were fully dried in a vacuum oven, and weighed in a molar ratio of $BaF_2$:$YF_3$=0.80:0.20. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a plastic bag and isostatically pressed in an isostatic press, and then placed in a vacuum furnace for vacuum sintering at a temperature of 900 to 1200° C., and cooled, to obtain $Ba_{0.8}Y_{0.2}F_{2.2}$ polycrystalline material, wherein the isostatic pressing treatment was performed at a pressure of 20 MPa for 0.5 hour.

3) Alternatively, the mixture was fed into a plastic bag and isostatically pressed in an isostatic press, and then transferred into a high-purity graphite or a glassy carbon crucible, placed in a vacuum furnace for sintering at a temperature of 1000° C., and cooled, to obtain $Ba_{0.8}Y_{0.2}F_{2.2}$ polycrystalline material.

4) The $Ba_{0.8}Y_{0.2}F_{2.2}$ polycrystalline material and an appropriate amount of $PbF_2$ powder were fed into a glassy carbon crucible having a capillary structure at the bottom and having an inner diameter of 80 mm. The glassy carbon crucible filled with the raw materials was placed in a vacuum crucible descending furnace. The deoxidizer $PbF_2$ was added in an amount of 1.5 wt % of the $Ba_{(1-x)}Y_xF_{2+x}$ polycrystalline material.

5) A vacuum pumping device was turned on so that the vacuum degree inside the furnace was less than $10^{-3}$ Pa, and then the temperature was gradually increased to 1250° C. to thoroughly melt the raw material, and a descending device was turned on for crystal growth, wherein the descending speed was 1 mm/h. After the growth was completed, the crystal was cooled to room temperature at a temperature decreasing rate of 10° C./hour, and the crystal ingot with a diameter of 80 mm was taken out for machining.

Comparative Example 1

Preparation of Pure (Undoped) $BaF_2$ Crystal

1) $BaF_2$ having a purity of 99.99% was used as the starting material, and heated in a vacuum oven at 200° C. for 20 hours. An appropriate amount of $PbF_2$ was weighed as a deoxidizer. $BaF_2$ and $PbF_2$ were thoroughly mixed to obtain a $BaF_2$—$PbF_2$ mixture.

2) The $BaF_2$—$PbF_2$ mixture was fed into a high-purity graphite crucible, and then thoroughly melted in a vacuum furnace at 1300° C. to obtain a $BaF_2$—$YF_3$ solid solution melt. The melt was cooled to room temperature to obtain $BaF_2$ polycrystalline material.

3) A high-purity graphite crucible or a glassy carbon crucible having a capillary structure at the bottom was machined according to the size and number of crystals to be grown, and the $BaF_2$ polycrystalline material and an appropriate amount of $PbF_2$ powder were fed into the graphite crucible, and placed into a vacuum crucible descending furnace, wherein the deoxidizer $PbF_2$ was added in an amount of 0.5 wt % of the $BaF_2$ polycrystalline material.

4) A vacuum pumping device was turned on so that the vacuum degree inside the furnace was less than $10^{-3}$ Pa, and then the temperature was gradually increased to 1300° C. to thoroughly melt the raw material, and a descending device was turned on for crystal growth, wherein the descending speed was 2 mm/h. After the growth was completed, the crystal was cooled to room temperature at a temperature decreasing rate of 20° C./hour, and the crystal ingot was taken out for machining.

Use of Pure $BaF_2$ Crystal in Radiation Detection

Figure 4:
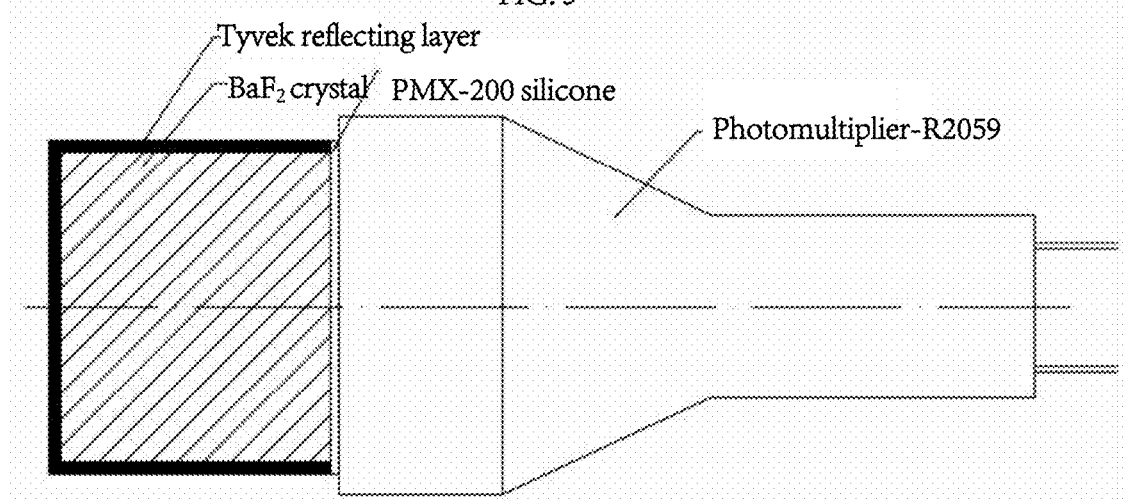
FIG. 4 shows a scintillation crystal probe composed of an undoped $BaF_2$ crystal and a photomultiplier tube R2059.

The crystal ingot obtained in Comparative Example 1 was machined into a $BaF_2$ crystal having a size of 30*30*20 $mm^3$. A Hamamatsu R2059 photomultiplier tube (PMT) was coupled to one 30*30 $mm^2$ end surface of the crystal with a coupling silicone grease (Dow Corning XIAMETER® PMX-200), and the other surfaces were wrapped with Tyvek, to form a scintillation crystal probe as shown in FIG. 4.

Example 4

Use of Y-Doped $BaF_2$ Crystal in Radiation Detection

Figure 5:
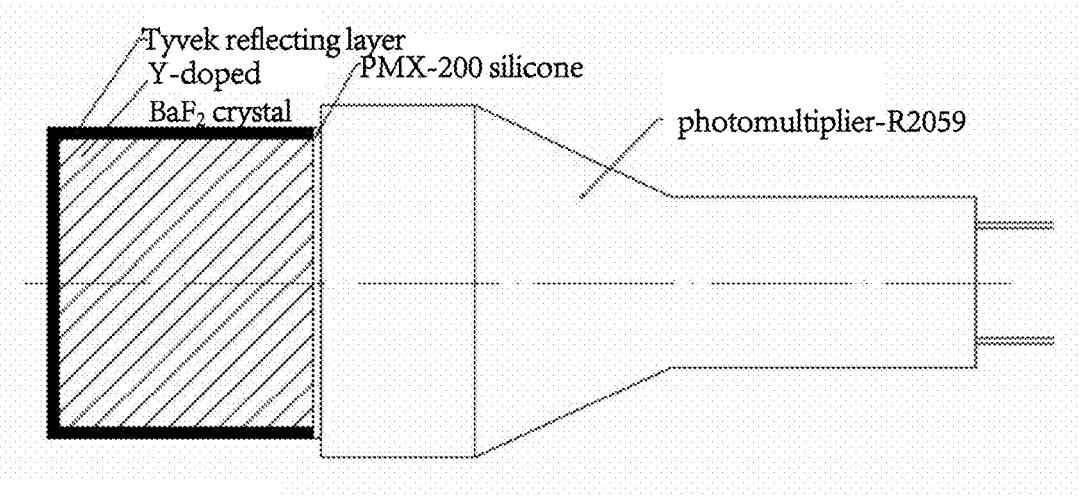
FIG. 5 shows a scintillation crystal probe composed of a Y-doped $BaF_2$ crystal and a photomultiplier tube R2059.

The crystal ingot obtained in Example 1 was machined into a 1 at % Y-doped $BaF_2$ crystal having a size of 30*30*20 $mm^3$. One 30*30 $mm^2$ end surface of the crystal was coupled to a Hamamatsu R2059 photomultiplier tube (PMT) with a coupling silicone grease (Dow Corning XIAMETER® PMX-200), and the other surfaces of the crystal were wrapped with Tyvek, to form a scintillation crystal probe as shown in FIG. 5. The probe has excellent slow component suppression and time-resolved properties, and can be used in radiation detection such as high energy physics, nuclear physics, nuclear medicine imaging, X-ray imaging, etc.

Example 5

Use of Y-Doped $BaF_2$ Crystal in Radiation Detection

Figure 6:
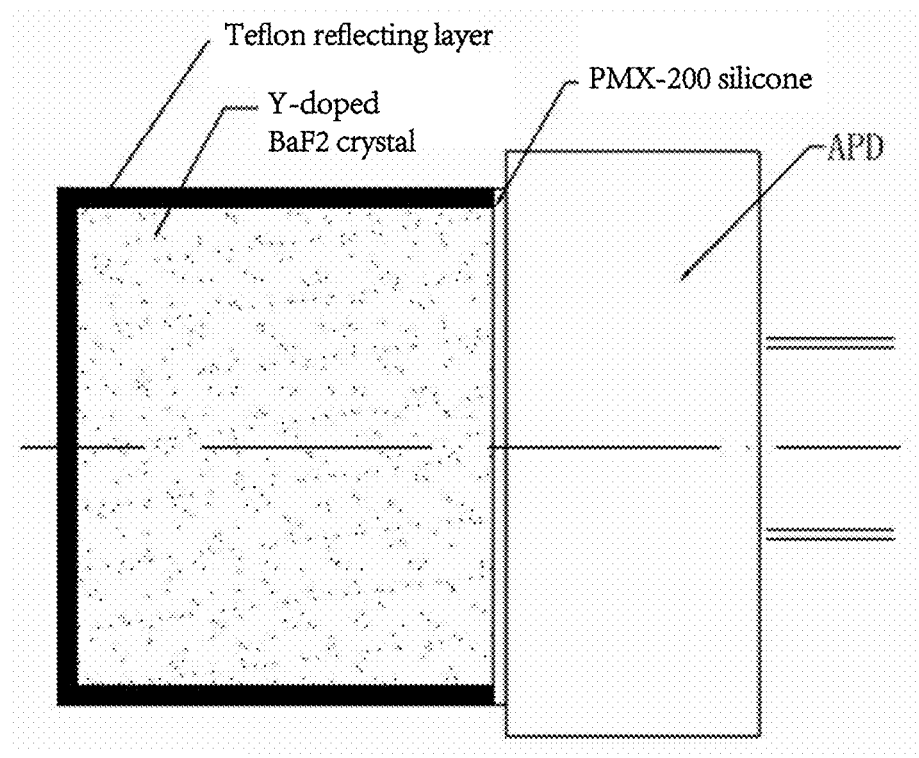
FIG. 6 shows a scintillator probe composed of a Y-doped $BaF_2$ microcrystalline/organic composite scintillator and APD.

The crystal obtained in Example 2 was ground into a monocrystalline powder and uniformly dispersed in a high ultraviolet ray-transmissive epoxy resin to prepare a composite scintillator having a size of Φ5*5 mm³. One Φ5 mm of the crystal was coupled to a UV-sensitive avalanche photodiode (APD) to with a coupling silicone grease (Dow Corning XIAMETER® PMX-200), and the other surfaces of the crystal were wrapped with Teflon tape, to form a scintillation crystal probe as shown in FIG. 6. The probe has excellent slow component suppression and time-resolved properties, and can be used in radiation detection such as high energy physics, nuclear physics, nuclear medicine imaging, X-ray imaging, etc.

Example 6

Use of Y-Doped $BaF_2$ Crystal in Radiation Detection

Figure 7:
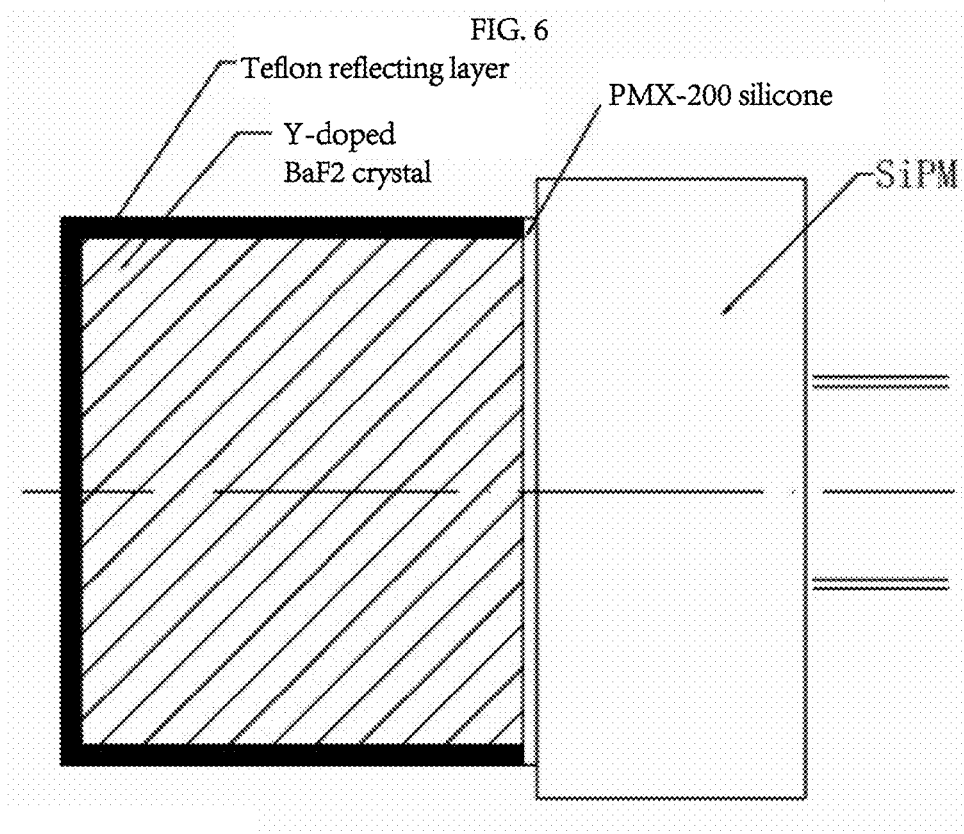
FIG. 7 shows a scintillation crystal probe composed of a Y⁻doped $BaF_2$ crystal and a SiPM.

The crystal ingot obtained in Example 2 was machined into a Y⁻doped $BaF_2$ crystal having a size of 10*10*10 mm³. One 10*10 mm² surface of the crystal was coupled to a silicon photomultiplier (SiPM) with a coupling silicone grease (Dow Corning XIAMETER® PMX-200), and the other surfaces of the crystal were wrapped with Tyvek, to form a scintillation crystal probe as shown in FIG. 7. The probe has excellent slow component suppression and time-resolved properties, and can be used in radiation detection such as high energy physics, nuclear physics, nuclear medicine imaging, X-ray imaging, etc.

Example 7

Preparation of 30 at % Y-Doped $BaF_2$ Crystal

1) $BaF_2$ having a purity of 99.99% and $YF_3$ having a purity of 99.99% were used as the starting materials. These starting materials were fully dried in a vacuum oven, and weighed in a molar ratio of $BaF_2$:$YF_3$=0.70:0.30. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a glassy carbon crucible, and then thoroughly melted in a vacuum furnace at 1350° C. to obtain a $BaF_2$—$YF_3$ solid solution melt. The melt was cooled to room temperature to obtain $Ba_{0.7}Y_{0.3}F_{2.3}$ polycrystalline material.

3) A high-purity graphite crucible having a capillary structure at the bottom was machined according to the size and number of crystals to be grown, and the $Ba_{0.7}Y_{0.3}F_{2.3}$ polycrystalline material and an appropriate amount of $PbF_2$ powder were fed into the graphite crucible, and placed into a vacuum crucible descending furnace.

4) A vacuum pumping device was turned on so that the vacuum degree inside the furnace was less than $10^{-3}$ Pa, and then the temperature was gradually increased to thoroughly melt the raw material, and a descending device was turned on for crystal growth, wherein the descending speed was 1 mm/h. After the growth was completed, the crystal was cooled to room temperature at a temperature decreasing rate of 20° C./hour, and the crystal ingot was taken out for machining.

Example 8

Preparation of 40 at % Y-Doped $BaF_2$ Crystal

1) $BaF_2$ having a purity of 99.99% and $YF_3$ having a purity of 99.99% were used as the starting materials. These starting materials were fully dried in a vacuum oven, and weighed in a molar ratio of $BaF_2$:$YF_3$=0.60:0.40. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a glassy carbon crucible, and then thoroughly melted in a vacuum furnace at 1350° C. to obtain a $BaF_2$—$YF_3$ solid solution melt. The melt was cooled to room temperature to obtain $Ba_{0.6}Y_{0.4}F_{2.4}$ polycrystalline material.

3) A high-purity graphite crucible having a capillary structure at the bottom was processed according to the size and number of crystals to be grown, and the $Ba_{0.6}Y_{0.4}F_{2.4}$ polycrystalline material and an appropriate amount of $PbF_2$ powder were fed into the graphite crucible, and placed into a vacuum crucible descending furnace.

4) A vacuum pumping device was turned on so that the vacuum degree inside the furnace was less than $10^{-3}$ Pa, and then the temperature was gradually increased to thoroughly melt the raw material, and a descending device was turned on for crystal growth, wherein the descending speed was 0.8 mm/h. After the growth was completed, the crystal was cooled to room temperature at a temperature decreasing rate of 15° C./hour, and the crystal ingot was taken out for machining.

Example 9

Preparation of 50 at % Y-Doped $BaF_2$ Crystal

1) $BaF_2$ having a purity of 99.99% and $YF_3$ having a purity of 99.99% were used as the starting materials. These starting materials were fully dried in a vacuum oven, and weighed in a molar ratio of $BaF_2$:$YF_3$=0.50:0.50. An appropriate amount of $PbF_2$ was weighed as a deoxidizer. $BaF_2$, $YF_3$, and $PbF_2$ were thoroughly mixed to obtain a $BaF_2$—$YF_3$—$PbF_2$ mixture.

2) The $BaF_2$—$YF_3$—$PbF_2$ mixture was fed into a glassy carbon crucible, and then thoroughly melted in a vacuum furnace at 1360° C. to obtain a $BaF_2$—$YF_3$ solid solution melt. The melt was cooled to room temperature to obtain $Ba_{0.5}Y_{0.5}F_{2.5}$ polycrystalline material.

3) A high-purity graphite crucible having a capillary structure at the bottom was processed according to the size and number of crystals to be grown, and the $Ba_{0.5}Y_{0.5}F_{2.5}$ polycrystalline material and an appropriate amount of $PbF_2$ powder were fed into the graphite crucible, and placed into a vacuum crucible descending furnace.

4) A vacuum pumping device was turned on so that the vacuum degree inside the furnace was less than $10^{-3}$ Pa, and then the temperature was gradually increased to thoroughly melt the raw material, and a descending device was turned on for crystal growth, wherein the descending speed was 0.5 mm/h. After the growth was completed, the crystal was cooled to room temperature at a temperature decreasing rate of 10° C./hour, and the crystal ingot was taken out for machining.

In order to fully understand the invention, some specific technical details and processes are described in the above examples, but the invention may also be implemented in other ways than the above description, and those skilled in the art can make similar expansion without departing the content of this invention.

The invention claimed is:

1. A method for preparing an yttrium-doped barium fluoride scintillation crystal having a chemical composition of $Ba_{(1-x)}Y_xF_{2+x}$, wherein $0.01 \leq x \leq 0.50$, and the method comprises the steps of:

weighing and mixing raw materials of $YF_3$ and $BaF_2$ according to the molar ratio $BaF_2:YF_3=(1-x): x$ to obtain a mixed powder, wherein $0.01 \leq x \leq 0.50$;

putting the mixed raw materials into crucibles in a vacuum furnace for thorough melting at a temperature of 1200 to 1400° C., and then cooling the mixture to obtain $Ba_{(1-x)}Y_xF_{2+x}$ polycrystalline material, or subjecting the mixed powder to isostatic pressing, and putting the resulting substance into crucibles and sintering it at 900 to 1200° C. in vacuum to obtain sintered $Ba_{(1-x)}Y_xF_{2+x}$ polycrystalline material; and mixing the resulting polycrystalline material with an appropriate amount of $PbF_2$ powder, which is act as a deoxidizer, and growing crystals by vertical Bridgman method;

wherein the processes of the vertical Bridgman method include:

maintaining the furnace in a vacuum degree of less than $10^{-3}$ Pa, melting the $Ba_{(1-x)}Y_xF_{2+x}$ polycrystalline material and $PbF_2$ powder at 1200 to 1400° C., subjecting the resulting melt to crystal growth wherein the descending speed of the crucible is 0.5 to 4 mm/hour, and cooling the grown crystal to room temperature at a temperature decreasing rate of 10 to 50° C./hour;

wherein the deoxidizer $PbF_2$ is added in an amount of 0.5 to 5 wt % of the $Ba_{(1-x)}Y_xF_{2+x}$ polycrystalline material.

2. The method of claim 1, wherein the crucibles are high purity graphite crucibles or glassy carbon crucibles.

3. The method of claim 1, wherein the deoxidizer $PbF_2$ is added in an amount of 0.5 to 2 wt % of the $Ba_{(1-x)}Y_xF_{2+x}$ polycrystalline material.

4. The method of claim 1, wherein the isostatic pressing is performed at a pressure of 5 to 20 MPa for 0.1 to 1 hour.

* * * * *